(12) United States Patent
Burns

(10) Patent No.: US 6,288,907 B1
(45) Date of Patent: Sep. 11, 2001

(54) HIGH DENSITY INTEGRATED CIRCUIT MODULE WITH COMPLEX ELECTRICAL INTERCONNECT RAILS HAVING ELECTRICAL INTERCONNECT STRAIN RELIEF

(75) Inventor: Carmen D. Burns, Austin, TX (US)

(73) Assignee: Staktek Group, L.P., Austin, TX (US)

( * ) Notice: Subject to any disclaimer, the term of this patent is extended or adjusted under 35 U.S.C. 154(b) by 0 days.

(21) Appl. No.: 09/343,432

(22) Filed: Jun. 30, 1999

Related U.S. Application Data

(60) Continuation of application No. 09/021,744, filed on Feb. 11, 1998, now Pat. No. 5,960,539, which is a division of application No. 08/650,721, filed on May 20, 1996, now Pat. No. 5,778,522.

(51) Int. Cl.[7] ............................ H01L 23/48; H01L 23/50
(52) U.S. Cl. ..................... 361/783; 361/735; 361/760; 361/773; 361/810; 361/813; 257/669; 257/686; 257/693; 257/723
(58) Field of Search .................................. 361/735, 760, 361/783, 790, 803, 807, 809, 810, 813, 773; 257/686, 691, 723, 724, 669, 693; 29/854, 857

(56) References Cited

U.S. PATENT DOCUMENTS

| | | | |
|---|---|---|---|
| Re. 36,916 | * 10/2000 | Moshayedi | 257/723 |
| 4,103,318 | 7/1978 | Schwede | 361/707 |
| 4,932,873 | 6/1990 | La Shier | 439/76 |
| 4,956,694 | 9/1990 | Eide | 387/74 |
| 5,057,026 | 10/1991 | Sawai et al. | 439/76 |
| 5,236,117 | 8/1993 | Roane et al. | 228/180.21 |
| 5,279,029 | * 1/1994 | Burns | 29/856 |
| 5,279,991 | 1/1994 | Minahan et al. | 437/208 |
| 5,281,852 | 1/1994 | Normington | 257/685 |
| 5,343,075 | * 8/1994 | Nishino | 257/686 |
| 5,367,766 | * 11/1994 | Burns et al. | 29/848 |
| 5,394,010 | 2/1995 | Tazawa et al. | 257/686 |
| 5,475,920 | * 12/1995 | Burns et al. | 29/856 |
| 5,499,160 | 3/1996 | Burns | 361/704 |
| 5,514,907 | 5/1996 | Moshyayedi | 257/686 |
| 5,523,619 | 6/1996 | McAllister et al. | 257/686 |
| 5,543,664 | * 8/1996 | Burns | 257/686 |
| 5,592,364 | * 1/1997 | Roane | 361/735 |
| 5,602,420 | * 2/1997 | Ogata et al. | 257/686 |
| 5,635,757 | * 6/1997 | Stockmeier et al. | 257/691 |
| 5,637,536 | * 6/1997 | Val | 257/723 |
| 5,754,405 | * 5/1998 | Derouiche | 257/686 |
| 6,025,642 | * 2/2000 | Burns | 257/686 |

OTHER PUBLICATIONS

Catalog of Dense–Pac Microsystems, Inc. describing two products: DPS512X16A3 Ceramic 512K X 16 CMOS SRAM MODULE and DPS512X16AA3 High Speed Ceramic 512K X 16 CMOS SRAM Module, pp. 865–870.

* cited by examiner

Primary Examiner—Jeffrey Gaffin
Assistant Examiner—John B. Vigushin
(74) Attorney, Agent, or Firm—J. Scott Denko; George & Donaldson, L.L.P.

(57) ABSTRACT

A high density integrated circuit module having complex electrical interconnection is described, which includes a plurality of stacked level-one integrated circuit devices, wherein each level-one device includes an integrated circuit die and a plurality of electrical leads extending from the die; and a plurality of non-linear rails adapted to electrically and thermally interconnect selected leads of selected stacked level-one devices within the module, wherein at least some of the plurality of non-linear rail include a lead interconnect portion which is adapted to at most partially surround and receive a selected lead from one of the stacked level-one devices. Other embodiments include TSOP modules having leads reduced in width to allow additional selected non-linear rails to interconnect with select leads in the module. Strain relief for the rail/circuit board substrate connection in harsh environment applications is also provided.

3 Claims, 2 Drawing Sheets

HIGH DENSITY INTEGRATED CIRCUIT MODULE WITH COMPLEX ELECTRICAL INTERCONNECT RAILS HAVING ELECTRICAL INTERCONNECT STRAIN RELIEF

CROSS-REFERENCE TO RELATED APPLICATIONS

This Application is a Continuation of U.S. application Ser. No. 09/021,744, filed Feb. 11, 1998, now U.S. Pat. No. 5,960,539, which is a Divisional of U.S. application Ser. No. 08/650,721, filed May 20, 1996, now U.S. Pat. No. 5,778,522, issued Jul. 14, 1998, and incorporated by reference herein for all purposes.

BACKGROUND OF THE INVENTION

1. Field of the Invention

This invention relates to a high-density, integrated circuit module, which includes a plurality of stacked individual integrated circuit devices including complex geometric or serpentine interconnect rails for selectively interconnecting leads of the stacked integrated circuit devices to each other and to external circuitry, which includes strain relief.

2. Discussion of the Related Technology

One method of achieving an ultra high density integrated circuit module, which includes stacked individual integrated circuit devices, is to use external electrical interconnect rails to interconnect electrical leads extending from the stacked individual integrated circuit devices within the module. This method and high density module is described in U.S. Pat. Nos. 5,279,029 and 5,367,766, which are assigned to the common assignee of the present invention and are incorporated by reference herein for all purposes.

In applications where the high density integrated circuit module includes dissimilar integrated circuit devices, e.g. memory devices, microprocessor, DMA device, etc., or where the lead-to-lead spacing of individual devices is not uniform, there is a need for a non-linear signal path that provides selectable electrical interconnections between the dissimilar integrated circuit devices which make up the module.

In previous methods and apparatus for electrically interconnecting the leads of stacked integrated circuit devices within a high density module, the electrical interconnect rails associated with these prior art devices are typically linear, i.e. the leads in each respective column of leads in the stack of packages are electrically and thermally interconnected to a single linear rail. Thus, making an electrical connection only between alternating leads in a particular column of leads in the stack, or only between leads of every third or fourth device in the stack, is very, difficult. Leads from integrated circuit devices which are not to be electrically connected to the linear rails must be trimmed internally or externally so as to not contact the rail or, at the very least, bent away from the rails so a solder connection between the rails and the leads is not made. This requires a more complex and costly manufacturing process.

Previous methods which use non-linear rail interconnections, such as those described in application Ser. No. 08/377,578, entitled "High Density Integrated Circuit Module With Complex Electrical Interconnect Rails", assigned to the common assignee of the present invention and incorporated herein for all purposes, use non-linear rails having apertures formed therein for receiving leads to be connected to the non-linear rail. However, the non-linear rail is wider at the aperture portion than at other portion along the rail, since the aperture is completely surrounded by the rail. In applications where the lead centers of integrated circuit devices in the stacked module are closer together, the relatively large width of the rails at the apertures may make it more difficult to route additional non-linear rails between adjacent rails if the rails completely surround the aperture, thereby creating a more narrow space between adjacent rails.

Thus, the need exists for a non-linear rail design which enables complex electrical rails to be routed between adjacent rails as lead centers of devices get more narrow.

SUMMARY OF INVENTION

The present invention provides a method and apparatus for selectively interconnecting leads of individual integrated circuit devices stacked within a high density integrated circuit module. The electrical interconnections are made by rails of the present invention which have a non-linear complex geometric, or serpentine-shape, so as to be readily adapted to selectively interconnect with leads from selected packages within each stack in complex patterns.

It is also a feature of the present invention that the complex rail assembly may be formed much like conventional lead frames used for internal die connections. That is, the rail assembly of the present invention may be formed out of copper sheet metal stock having shorting bars supporting individual conductors or rails until the bars are sheared in final assembly. This method is particularly advantageous in those more complex applications when the rails are narrow and closely spaced.

The serpentine configured rails weave around leads of integrated circuit devices within the module that are not to be connected to that particular rail. Because of this, manufacturing becomes simplified since integrated circuit leads that are not to be connected will not have to be trimmed or otherwise removed and accidental undesired solder connections between unselected leads and the rail will be reduced. However, in applications where the lead centers of devices in the stacked module are closer together, the relatively large width of the rails at the portion of the rails which completely surround the apertures formed therein for receiving leads of devices to be interconnected, may make it more difficult to route other non-linear rails between adjacent rails if the aperture portion of adjacent rails are close together. Therefore, in selected rails, the portion of the rail in proximity to certain apertures in the rail is formed so the rail forms a partial aperture for receiving a selected lead. This provides for greater clearance between adjacent rails so the additional selected non-linear rails can be routed therebetween.

In a case where the high density integrated circuit module includes several SRAM devices, a DMA device, a microprocessor, and other assorted integrated circuit devices, a particular serpentine rail is electrically connected to only to address or data leads of selected integrated circuit devices within the module. It is in these applications where stacks, or modules, made up of dissimilar integrated circuit devices are used, or in applications where lead-to-lead spacing between individual devices is not uniform, that the non-linear serpentine rail configuration is desired.

In addition to the methods described above for increasing the ability of routing additional selected non-linear rails between adjacent rails, the leads of a TSOP device may be straightened and then partially cut to decrease the lead width which increases the gap between adjacent rails. Using this method, additional selected non-linear rails may be routed between adjacent rails, allowing for selected electrical interconnection of leads within the module.

The present invention also provides for strain relief for electrical connections made between the lead/rail electrical connection and the connection of the bottom portion of a rail to an underlying circuit board, or substrate.

DETAILED DESCRIPTION OF THE PREFERRED EMBODIMENT

Figure 1:
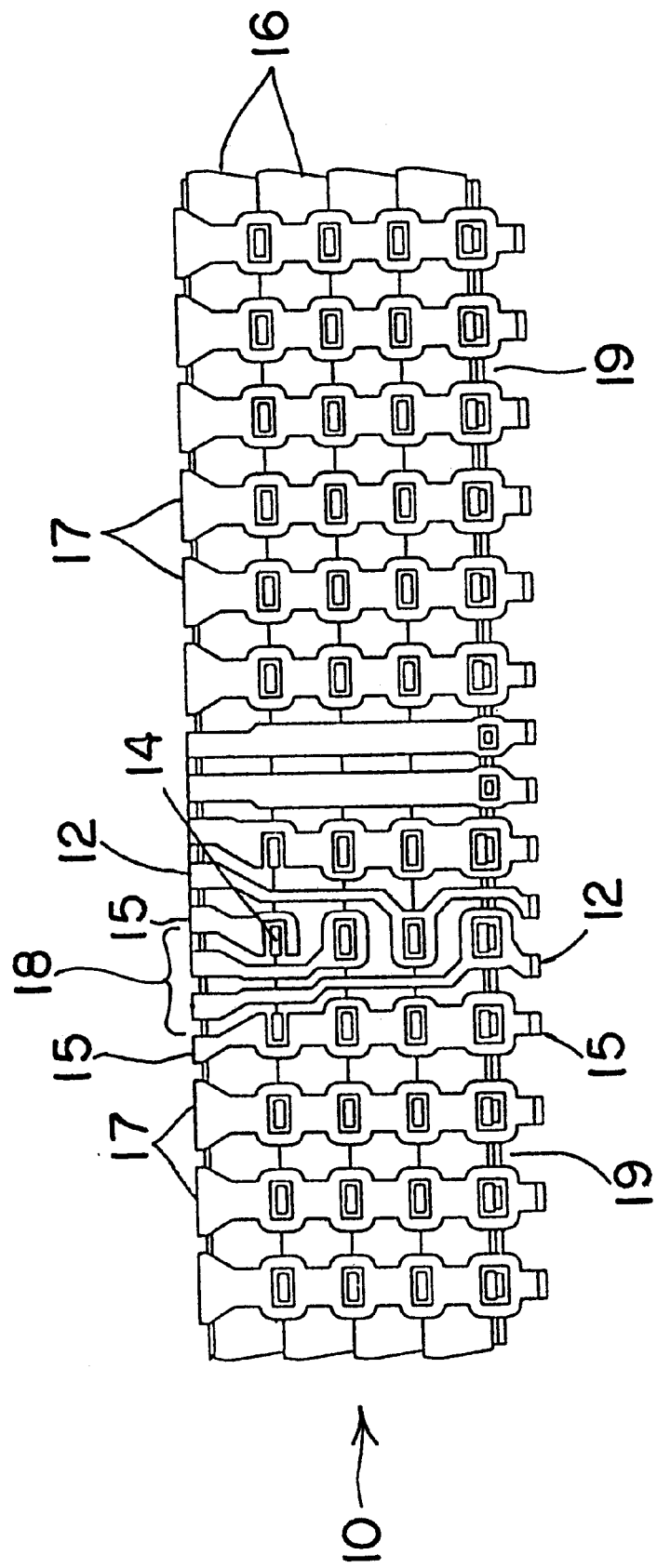
FIG. 1 is a side view of the high density integrated circuit module and selected non-linear electrical interconnect leads of the present invention.

FIG. 1 illustrates both non-linear complex serpentine interconnect rails 12 and linear interconnect rails 17 of the present invention. As can be seen, non-linear rails 12 are selectively connected to selected electrical leads 14 of selected TSOP (Thin Small Outline Package) integrated circuit devices 16. Both types of rails 12 and 17 are electrically and thermally connected to the selected leads 14. When TSOP devices 16 are vertically stacked to form a high density integrated circuit module 10, it is frequently necessary to make electrical connection with only certain leads 14 of certain TSOP devices 16 within module 10. Use of select non-linear rails 12 allows for individual interconnection of selected leads 14.

As TSOPs are being manufactured with ever decreasing distances between the lead center of adjacent leads, it becomes more difficult to route additional non-linear rails 12 in the gap area 18 between adjacent serpentine rails 12 or linear rails 17, to make connections with other leads 14.

One method of solving this problem is to form selected rails 15 so only a partial aperture is formed in the rail to receive and partially surround a lead 14. By only partially surrounding a lead 14, the gap 18 between adjacent rails is maximized, which allows selected non-linear rails 12 to be routed through the gap 18 to make their own selected connection with other leads 14 in module 10. By illustration, gap 18 is wider than the more narrow gap 19 between adjacent linear rails 17 which are formed to completely surround a lead 14. The extra width of gap 18 is very useful in applications where TSOP devices 16 are used since TSOP devices 16 typically have dedicated leads 14 for addressing, control, etc. which cannot be changed by the end user.

Figure 2:
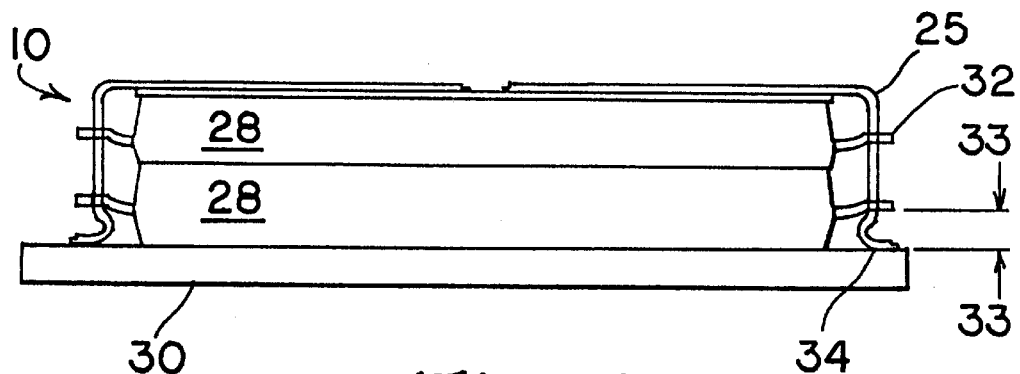
FIG. 2 is a side view of a module of the present invention illustrating a connection to an underlying substrate.

Referring to FIG. 2, another problem addressed herein is that of improved electrical connection integrity in harsh environment applications having extreme temperature variations, where a vertical rail assembly 25 is used in combination with a high density integrated circuit module 10, the module 10 being comprised of a plurality of vertically stacked individual high density integrated circuit devices 28. The rail assembly 25 is electrically connected to an underlying circuit board, or substrate 30, shown in outline. In harsh industrial environment applications, having extreme temperature ranges, the electrical connection between the rail assembly 25 and the substrate 30 may sometimes fail due to the different coefficients of expansion and contraction between the substrate 30 and the rail assembly 25.

This sort of failure is more common when a relatively stiff lead frame 32 made of alloy 42, commonly found in TSOP devices, is used in combination with a relatively stiff electrical rail assembly 25. To solve this problem first requires an understanding of the problem. Beam equations such as those shown below are used to calculate the deflection (σ) of a the substrate mounting portion 34 of rail assembly 25, with the following factors being considered: the moment of inertia of the rail cross section (I), the weight of the rail per unit length (w), the length of the rail (L), Young's modulus (E) and the applied force (F) on the rail. As the second equation shows, the moment of inertia (I) is a function of the height and width of the rail.

$$\sigma = \frac{FL^3}{3EI} \quad I = \frac{bh^3}{12}$$

Through experimentation and calculation, it has been determined that in these types of harsh industrial applications, it is important to use alloy 110 to manufacture the rail assembly for the module. Alloy 110 has a tensile strength of about 50,000 PSI and is softer than alloy 42, which allows the substrate mounting portion 34 of rail assembly 25 to deflect under the harsh environmental conditions without causing the rail assembly 25 to disengage from the underlying substrate 30. Alloy 195 could be used for the rail assembly 25, since it has greater tensile strength than alloy 110, but it is a poorer thermal conductor than alloy 110 and is therefore an undesirable choice. Thus, alloy 110, with its increased thermal conduction properties, is preferable to form the rail assembly 25 under these harsh conditions.

Referring to FIG. 2, in harsh environment applications, the preferred distance 33 from the bottom surface of the lead on lead frame 32 of device 28, to the bottom surface of the substrate mounting portion 34 of rail assembly 25 is typically 0.030 inches and greater. In less harsh environments, having less extreme temperature variations, this distance 33 may be as low as 0.022 inches without electrical disconnect problems between the rail assembly 25 and substrate 30 occurring.

Figure 3:
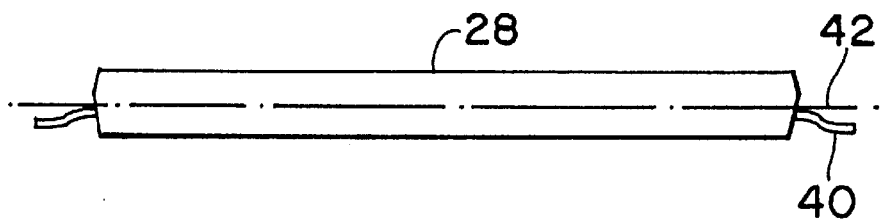
FIG. 3 is a side view of a typical TSOP device.

Since TSOP devices 28 typically have leads 40 which extend from the TSOP device from below the device center line 42 and protrude downward, as shown in FIG. 3, it may be necessary to invert one or more of the TSOP devices 28 when stacking them to form the high density integrated circuit module 10 of FIG. 1 or 2, so the leads 40 extend in an upward direction to ensure the proper distance from the lead/rail connection to the rail/substrate connection, described above, is achieved. Typically, TSOP leads 40 are reformed prior to being attached to the rail assembly 25 to allow for ease of manufacturing and attachment of the leads 40.

Figure 4:
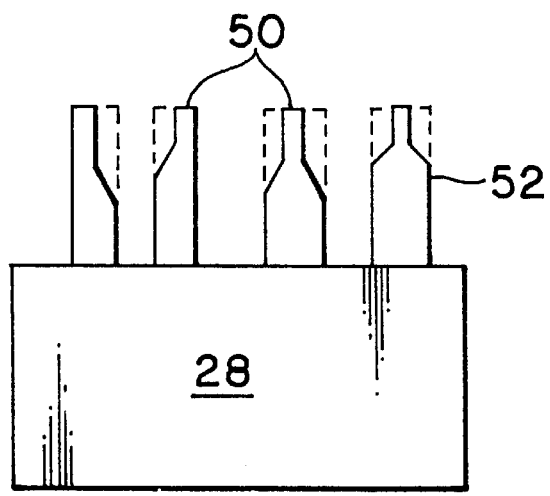
FIG. 4 is a top view a TSOP device having flattened and trimmed leads.

In addition to the methods described above for FIG. 1 for increasing the ability of routing additional selected non-linear rails 12 between adjacent rails, referring to FIG. 4, selected TSOP leads 50 are straightened and then partially cut, in various patterns, to decrease the lead width, preferably by up to one-half, thereby increasing the free area gap 18 (FIG. 1) between adjacent rails. Using this method, additional selected non-linear rails 12 may be routed between adjacent rails, allowing for selected electrical interconnection of selected leads 14 within module 10. The selected TSOP leads 50 are partially cut from the lead end 52 to a distance of about 0.010 inches from the TSOP device 28.

The foregoing disclosure and description of the invention are illustrative and explanatory of the preferred embodiments, and changes in the materials, individual components, circuit elements and connections may be made without departing from the spirit of the invention.

What is claimed is:

1. A high density integrated circuit module comprising:
    a plurality of level-one integrated circuit devices, each said level-one device including an integrated circuit die, a rectangular casing surrounding said die, said casing having an upper major surface and a perimeter edge and a plurality of electrical leads extending from said die through the perimeter edge of the casing; and
    a plurality of rails on each of at least two sides of the module, each rail formed of substantially planar material having a first and a second major surface, at least one of the rails having a partial aperture into the opening of which an electrical lead from one of the level-one devices is projected.

2. A high density integrated circuit module comprising:
    a plurality of level-one integrated circuit devices, each said level-one device including an integrated circuit die, a rectangular casing surrounding said die, said casing having an upper major surface and a perimeter edge and a plurality of electrical leads having first and second major surfaces, the electrical leads extending from said die through the perimeter edge of the casing; and
    a rail assembly on each of at least two sides of the module, comprised of non-linear and linear rails, at least one of which rails has a partial aperture into the opening of which an electrical lead from one of the level-one devices is projected, the rail assembly being connected in an interconnection network to the electrical leads to provide selected electrical interconnection amongst the level-one integrated circuit devices, the rail assembly having a substrate mounting portion comprised of alloy 110.

3. A high density integrated circuit module mounted on a substrate, the module comprising:
    a plurality of level-one integrated circuit devices, each said level-one device including an integrated circuit die, a rectangular casing surrounding said die, said casing having an upper major surface and a perimeter edge and a plurality of electrical leads having first and second major surfaces, the electrical leads extending from said die through the perimeter edge of the casing and in which the distance from the first major surface of the electrical leads of the level-one device closest to the substrate to the surface of the substrate is at least 0.030 inches; and
    a rail assembly connected in an interconnection network to the electrical leads to provide selected electrical interconnection amongst the level-one integrated circuit devices, the rail assembly having a substrate mounting portion comprised of alloy 110.

* * * * *